(12) United States Patent
Wu (10) Patent No.: US 12,190,991 B2
(45) Date of Patent: Jan. 7, 2025

(54) OFF-CHIP DRIVING DEVICE AND DRIVING CAPABILITY ENHANCEMENT METHOD THEREOF

(71) Applicant: NANYA TECHNOLOGY CORPORATION, New Taipei (TW)

(72) Inventor: Chang-Ting Wu, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 164 days.

(21) Appl. No.: 18/154,860

(22) Filed: Jan. 16, 2023

(65) Prior Publication Data

US 2024/0242747 A1     Jul. 18, 2024

(51) Int. Cl.
*G11C 7/10*        (2006.01)
(52) U.S. Cl.
CPC ......... *G11C 7/1066* (2013.01); *G11C 7/1093* (2013.01)
(58) Field of Classification Search
CPC ... G11C 7/1066; G11C 7/1093; G11C 7/1057; G11C 7/1069; G11C 7/02; G06F 13/1668
See application file for complete search history.

(56) References Cited

U.S. PATENT DOCUMENTS

| | | | |
|---|---|---|---|
| 6,448,807 B1 * | 9/2002 | Ahsanullah | H03K 17/164 |
| | | | 326/26 |
| 8,373,451 B1 | 2/2013 | Ferguson | |
| 9,735,760 B1 | 8/2017 | Zhou et al. | |
| 2011/0267112 A1 | 11/2011 | Lee et al. | |

FOREIGN PATENT DOCUMENTS

CN        107395193        11/2017

OTHER PUBLICATIONS

"Office Action of Taiwan Counterpart Application", issued on Mar. 12, 2024, p. 1-p. 5.

* cited by examiner

*Primary Examiner* — Xiaochun L Chen
(74) *Attorney, Agent, or Firm* — JCIPRNET (57) ABSTRACT

An off-chip driving device and a driving capability enhancement method thereof are provided. Detecting a rising edge and a falling edge of an input data signal. A first enhancement circuit is controlled to provide a first enhancement signal to an input/output pad according to the rising edge and the falling edge of the input data signal.

13 Claims, 10 Drawing Sheets

OFF-CHIP DRIVING DEVICE AND DRIVING CAPABILITY ENHANCEMENT METHOD THEREOF

BACKGROUND

Technical Field

The disclosure relates to a driving device, and more particularly relates to an off-chip driving device and a driving capability enhancement method thereof.

Description of Related Art

As the generation of memory products advances from DDR4 to DDR5, the operating speed of memories has also increased. Under high-speed transmission, the transmission channel effect causes the amplitude of the transmitted signal to attenuate. This signal attenuation phenomenon becomes more serious as the signal operating frequency increases, which results in the distortion of the data signal during transmission.

SUMMARY

The disclosure provides a driving capability enhancement method of an off-chip driving device, which prevents signal distortion under high-speed transmission and improves the quality of the output signal of the off-chip driving device.

An off-chip driving device according to an embodiment of the disclosure includes a driver circuit and a control circuit. The driver circuit includes at least one pull-up driver, at least one first resistor and a first enhancement circuit. The first resistor is coupled between the pull-up driver and an input/output pad. The first enhancement circuit is coupled to the first resistor. The control circuit is coupled to the pull-up driver and the first enhancement circuit, and detects a rising edge and a falling edge of an input data signal and controls the first enhancement circuit to provide a first enhancement signal to the input/output pad according to the rising edge and the falling edge of the input data signal.

In an embodiment of the disclosure, the first enhancement circuit is connected to a first end of the first resistor, a second end of the first resistor, or a position between the first end and the second end of the first resistor.

In an embodiment of the disclosure, the driver circuit further includes a first switching circuit. The first switching circuit is coupled between the first enhancement circuit and the first resistor, and is controlled by the control circuit to switch the first enhancement circuit to be connected to the first end of the first resistor, the second end of the first resistor, or the position between the first end and the second end of the first resistor.

In an embodiment of the disclosure, the first switching circuit includes a plurality of first switches respectively coupled between the first enhancement circuit and corresponding connection positions on the first resistor, and conduction states of the first switches are controlled by the control circuit.

In an embodiment of the disclosure, the driver circuit further comprises a pull-down driver, at least one second resistor and a second enhancement circuit. The pull-down driver is coupled to the control circuit. The second resistor is coupled between the pull-down driver and the input/output pad. The second enhancement circuit is coupled to the control circuit and the at least one second resistor, the control circuit controls the second enhancement circuit to provide a second enhancement signal to the input/output pad according to the rising edge and the falling edge of the input data signal.

In an embodiment of the disclosure, the second enhancement circuit is connected to a first end of the second resistor, a second end of the second resistor, or a position between the first end and the second end of the second resistor.

In an embodiment of the disclosure, the driver circuit further includes a second switching circuit. The first switching circuit is coupled between the first enhancement circuit and the first resistor, and is controlled by the control circuit to switch the first enhancement circuit to be connected to the first end of the first resistor, the second end of the first resistor, or the position between the first end and the second end of the first resistor.

In an embodiment of the disclosure, the second switching circuit includes a plurality of second switches respectively coupled between the second enhancement circuit and corresponding connection positions on the second resistor, and conduction states of the second switches are controlled by the control circuit.

In an embodiment of the disclosure, the control circuit further controls the second enhancement circuit to provide the second enhancement signal in response to the off-chip driving device being in an enhancement mode according to an enable signal, and controls the second enhancement circuit not to provide the second enhancement signal in response to the off-chip driving device being in a normal mode.

In an embodiment of the disclosure, the second enhancement circuit includes an N-type transistor coupled between the first resistor and a ground voltage. A control end of the N-type transistor is coupled to the control circuit, and the N-type transistor is controlled by the control circuit to be turned on in response to the input data signal having the falling edge.

In an embodiment of the disclosure, the control circuit further controls the first enhancement circuit to provide the first enhancement signal in response to the off-chip driving device being in an enhancement mode according to an enable signal, and controls the first enhancement circuit not to provide the first enhancement signal in response to the off-chip driving device being in a normal mode.

In an embodiment of the disclosure, the first enhancement circuit includes a P-type transistor coupled between a power supply voltage and the first resistor. A control end of the P-type transistor is coupled to the control circuit, and the P-type transistor is controlled by the control circuit to be turned on in response to the input data signal having the rising edge.

The disclosure further provides a driving capability enhancement method of an off-chip driving device. The off-chip driving device includes at least one pull-up driver, at least one first resistor, a first enhancement circuit, a pull-down driver, and at least one second resistor. The first resistor is coupled between the pull-up driver and an input/output pad. The second resistor is coupled between the pull-down driver and the input/output pad. The first enhancement circuit is coupled to the first resistor. The second enhancement circuit is coupled to the second resistor. The driving capability enhancement method of the off-chip driving device includes: detecting a rising edge and a falling edge of an input data signal: and controlling the first enhancement circuit and the second enhancement circuit to provide a first enhancement signal and a second enhancement signal to the input/output pad according to the rising edge and the falling edge of the input data signal, to enhance strength of driving signals of the pull-up driver and the pull-down driver.

In an embodiment of the disclosure, the first enhancement circuit is connected to a first end of the first resistor, a second end of the first resistor, or a position between the first end and the second end of the first resistor, and the second enhancement circuit is connected to a first end of the second resistor, a second end of the second resistor, or a position between the first end and the second end of the second resistor.

In an embodiment of the disclosure, the driving capability enhancement method of the off-chip driving device includes: controlling the first enhancement circuit and the second enhancement circuit to provide the first enhancement signal and the second enhancement signal in response to the off-chip driving device being in an enhancement mode according to an enable signal, and controlling the first enhancement circuit and the second enhancement circuit not to provide the first enhancement signal and the second enhancement signal in response to the off-chip driving device being in a normal mode.

Based on the above, the off-chip driving device according to an embodiment of the disclosure is capable of detecting the rising edge and the falling edge of the input data signal, and controlling the first enhancement circuit and the second enhancement circuit to provide the first enhancement signal and the second enhancement signal to the input/output pad according to the rising edge and the falling edge of the input data signal, so as to improve the slew rate and the output swing of the output signal, enhance the strength of the driving signals of the pull-up driver and the pull-down driver, and improve the driving capability of the off-chip driving device, thereby preventing the distortion of the output signal under high-speed transmission and improving the quality of the output signal of the off-chip driving device.

In order to make the above-mentioned and other features and advantages of the disclosure more comprehensible, exemplary embodiments are described in detail with the accompanying drawings as follows.

In order to achieve the above-mentioned features, relevant circuit will be described below as exemplary embodiments. It will be apparent to those skilled in the art that various modifications and variations may be made to the off-chip driving device without departing from the spirit of the disclosure.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
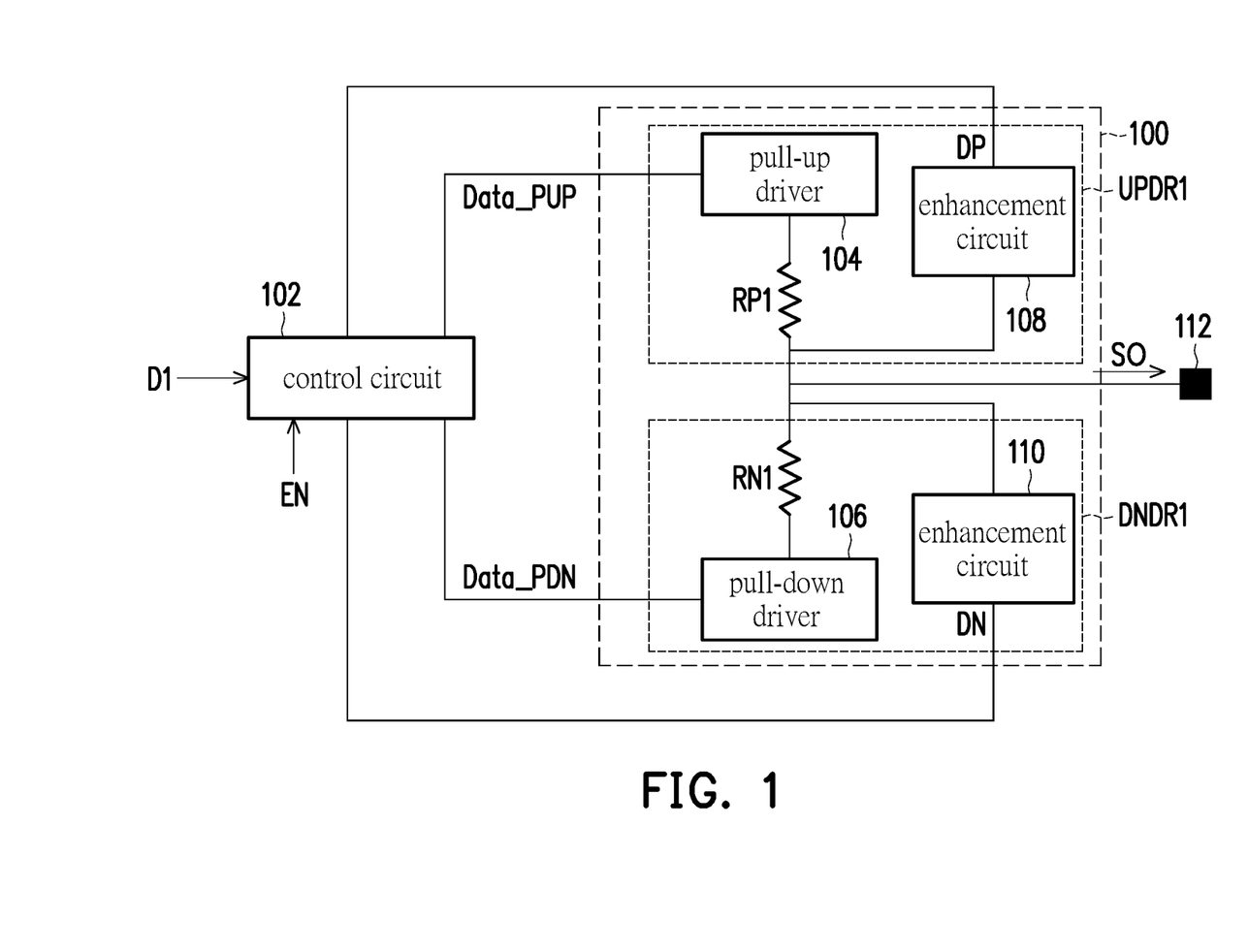
FIG. 1 is a schematic diagram of an off-chip driving device according to an embodiment of the disclosure.

FIG. 1 is a schematic diagram of an off-chip driving device according to an embodiment of the disclosure. Referring to FIG. 1, the off-chip driving device includes a driver circuit 100 and a control circuit 102, and the driver circuit 100 is coupled to the control circuit 102. Further, the driver circuit 100 may include a pull-up driver circuit UPDR1 composed of a pull-up driver 104, a resistor RP1, and an enhancement circuit 108, and a pull-down driver circuit DNDR1 composed of a pull-down driver 106, a resistor RN1, and an enhancement circuit 110. The pull-up driver 104 is coupled to the control circuit 102 and one end of the resistor RP1. The other end of the resistor RP1 is coupled to an input/output pad 112. The enhancement circuit 108 is coupled to the resistor RP1 and the control circuit 102. The pull-down driver 106 is coupled to the control circuit 102 and one end of the resistor RN1. The other end of the resistor RN1 is coupled to the input/output pad 112. The enhancement circuit 110 is coupled to the resistor RN1 and the control circuit 102.

The control circuit 102 may control the pull-up driver 104 and the pull-down driver 106 to provide driving signals according to an input data signal D1, so as to pull up or pull down the voltage level of an output signal SO output to the input/output pad 112, and enhance the signal strength of the driving signals provided by the pull-up driver 104 and the pull-down driver 106 through the enhancement circuits 108 and 110. Further, the control circuit 102 may detect a rising edge and a falling edge of the input data signal D1. When the data signal D1 has a rising edge, the control circuit 102 may control the pull-up driver 104 to provide the driving signal to pull up the voltage level of the output signal SO, and at the same time, control the enhancement circuit 108 to provide an enhancement signal, so as to enhance the signal strength of the driving signal provided by the pull-up driver 104. Similarly, when the data signal D1 has a falling edge, the control circuit 102 may control the pull-down driver 106 to provide the driving signal to pull down the voltage level of the output signal SO, and at the same time, control the enhancement circuit 110 to provide an enhancement signal, so as to enhance the signal strength of the driving signal provided by the pull-down driver 106.

The enhancement circuits 108 and 110 are controlled in this way to provide the enhancement signals to the input/output pad 112 according to the rising edge and the falling edge of the input data signal D1, so as to enhance the signal strength of the driving signals of the pull-up driver 104 and the pull-down driver 106, prevent the signal distortion of the output signal SO of the off-chip driving device under high-speed transmission, and improve the quality of the output signal SO of the off-chip driving device.

In addition, the control circuit 102 may determine whether to control the enhancement circuits 108 and 110 to enhance the driving signals provided by the pull-up driver 104 and the pull-down driver 106 according to an enable signal EN. For example, when the off-chip driving device is in an enhancement mode, the enhancement circuits 108 and 110 may be controlled to provide the enhancement signals to the input/output pad 112 according to usage requirements, and the enhancement circuits 108 and 110 may be controlled not to provide the enhancement signals to the input/output pad 112 when the off-chip driving circuit is in a normal mode.

Figure 2A:
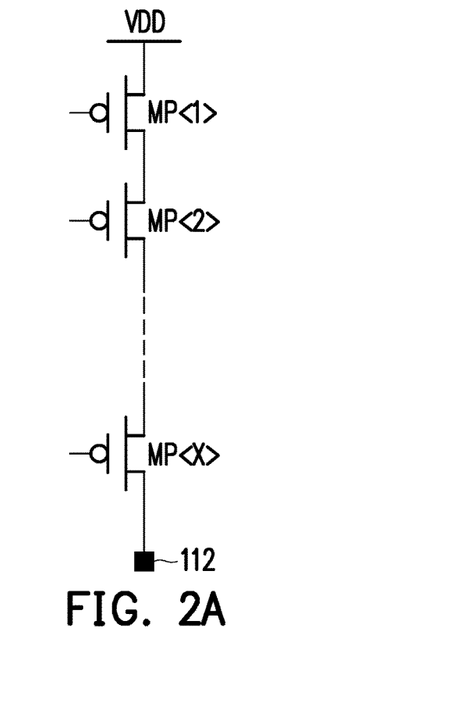
FIG. 2A and FIG. 2B are schematic diagrams of a pull-up driver according to an embodiment of the disclosure.
Figure 2B:
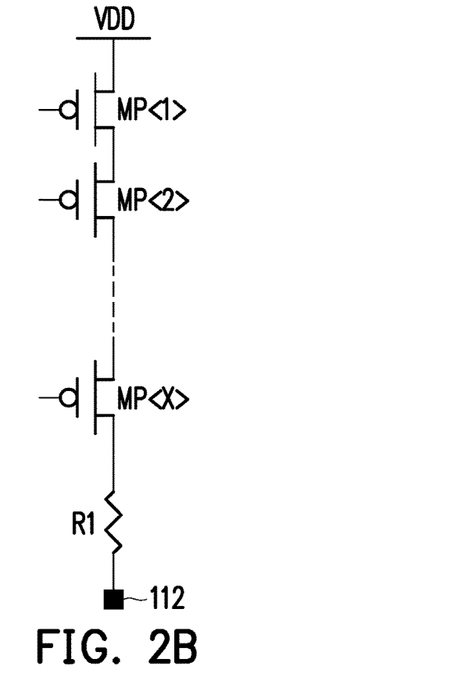
Figure 3A:
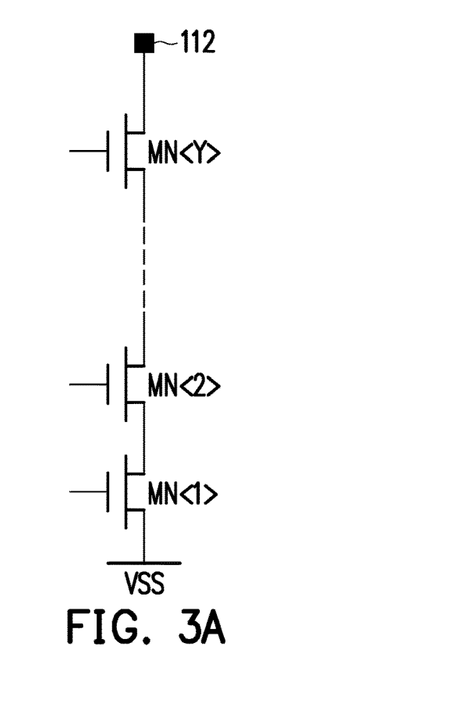
FIG. 3A and FIG. 3B are schematic diagrams of a pull-up driver according to an embodiment of the disclosure.
Figure 3B:
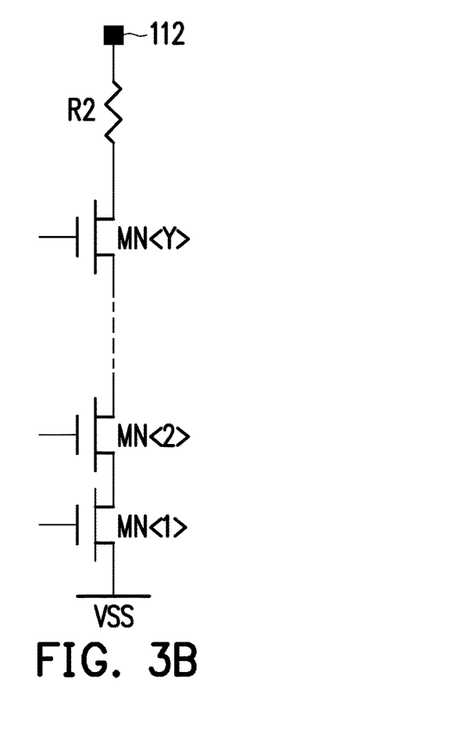

Specifically, an implementation of the pull-up driver 104 may be, for example, as shown in FIG. 2A or FIG. 2B. As shown in FIG. 2A, the pull-up driver 104 may include, for example, a plurality of P-type transistors MP<1> to MP<X> connected in series between a power supply voltage VDD and the input/output pad 112, where X is a positive integer. Alternatively, the pull-up driver 104 may also include a resistor R1 connected in series with the P-type transistors MP<1> to MP<X>, besides the P-type transistors MP<1> to MP<X>, as shown in FIG. 2B. Similarly, an implementation of the pull-down driver 106 may be, for example, as shown in FIG. 3A or FIG. 3B, which includes a plurality of N-type transistors MN<1> to MN<Y> connected in series between the input/output pad 112 and a reference voltage VSS, where Y is a positive integer, or includes the N-type transistors MN<1> to MN<Y> and a resistor R2 connected in series with the N-type transistors MN<1> to MN<Y>. The control circuit 102 may control the conduction states of the P-type transistors MP<1> to MP<X> and the N-type transistors MN<1> to MN<Y> to control the pull-up driver 104 and the pull-down driver 106 to provide the driving signals.

Figure 4:
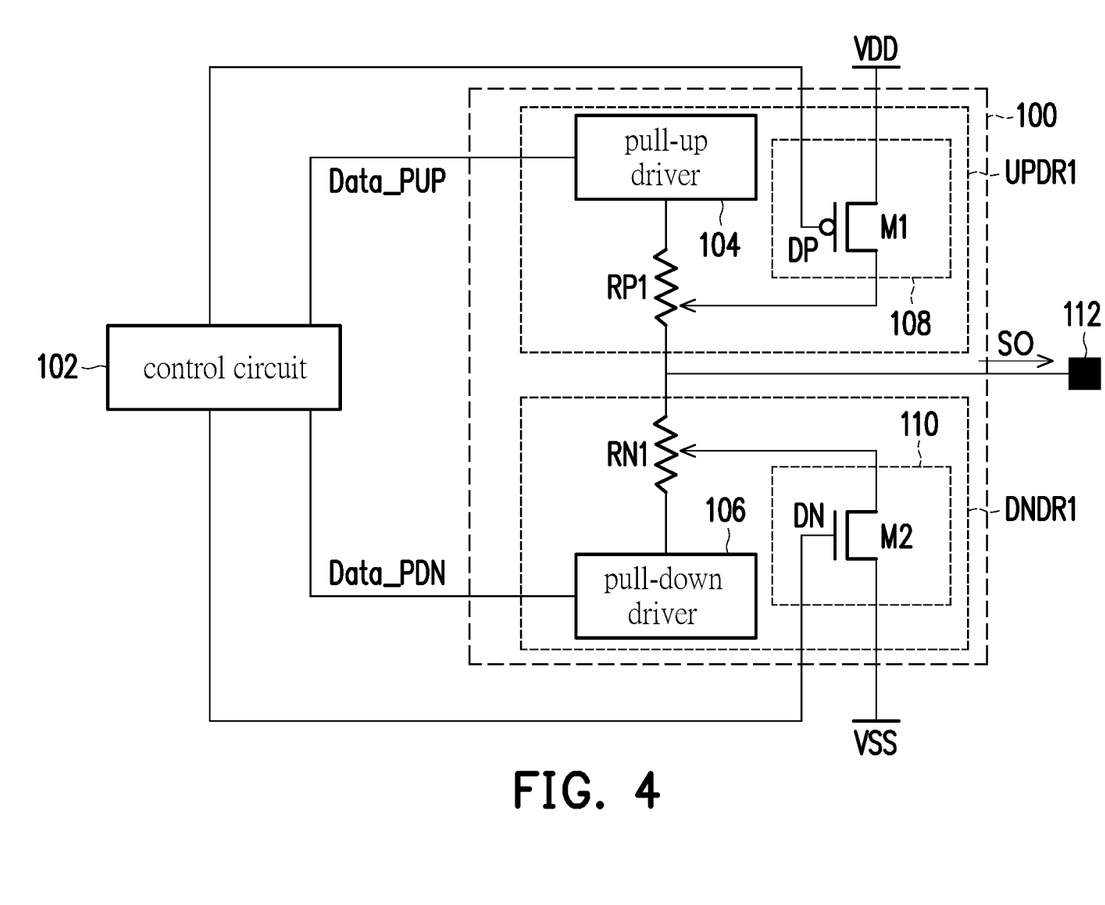
FIG. 4 is a schematic diagram of an off-chip driving device according to another embodiment of the disclosure.
Figure 5:
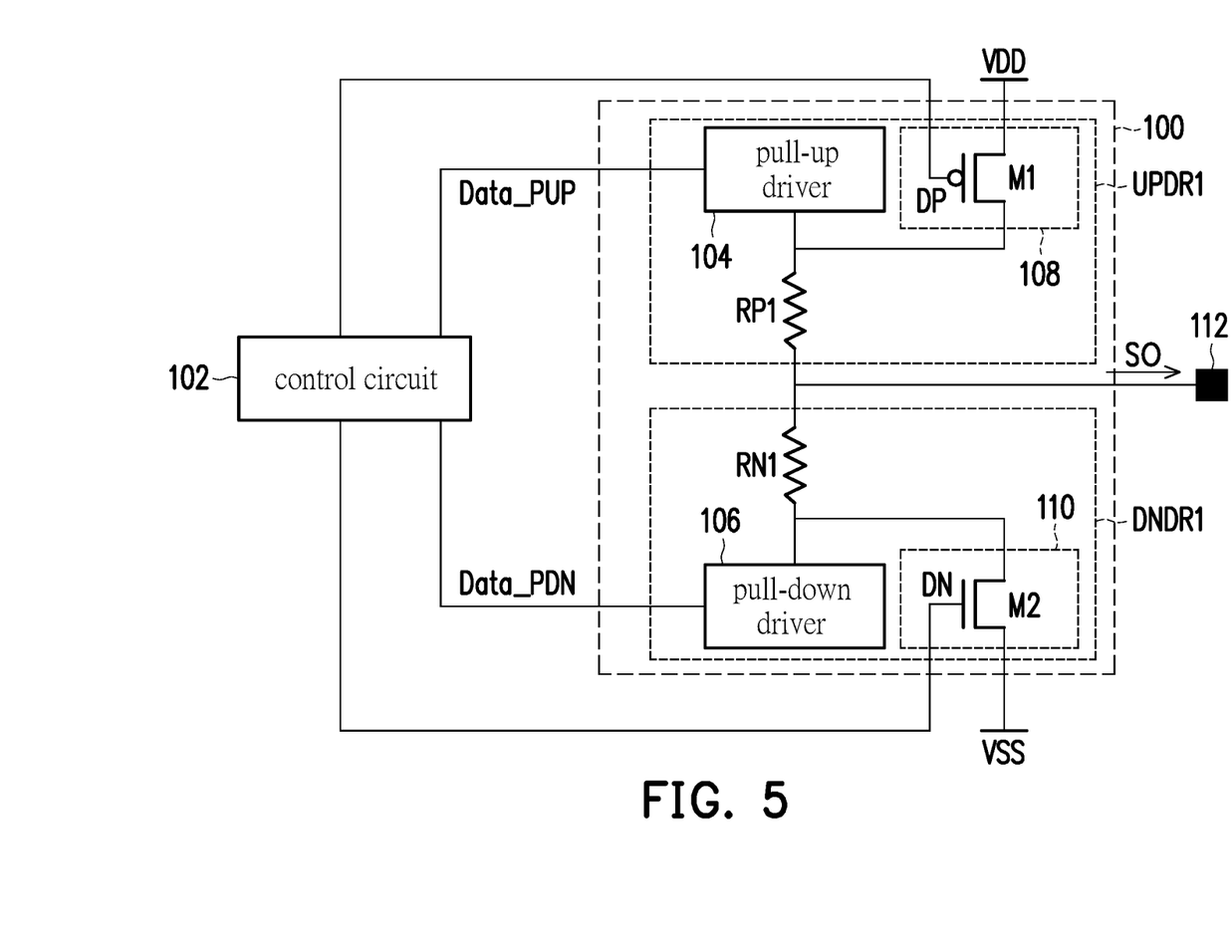
FIG. 5 is a schematic diagram of an off-chip driving device according to another embodiment of the disclosure.

In addition, in the embodiment of FIG. 1, the enhancement circuits 108 and 110 are respectively coupled to the ends of the resistors RP1 and RN1 close to the input/output pad 112. However, depending on the user's requirements for the driving capability of the output signal SO, the enhancement circuit 108 may also be coupled to a position between two ends of the resistor RP1 as shown in FIG. 4, and similarly, the enhancement circuit 110 may also be coupled to a position between two ends of the resistor RN1. If the positions where the enhancement circuits 108 and 110 are coupled to the resistors RP1 and RN1 are closer to the input/output pad 112, the output signal SO has a stronger driving capability. Alternatively, as shown in FIG. 5, the enhancement circuit 108 may be coupled to one end of the resistor RP1 close to the pull-up driver 104, and the enhancement circuit 110 may be coupled to one end of the resistor RN1 close to the pull-down driver 106. It should be noted that the position where the enhancement circuit 108 is coupled to the resistor RP1 does not need to correspond to the position where the enhancement circuit 110 is coupled to the resistor RN1. For example, the enhancement circuit 108 may be coupled to one end of the resistor RP1 while the enhancement circuit 110 is coupled to the middle position of the resistor RN1. The user can separately set the position where the enhancement circuit 108 is coupled to the resistor RP1 and the position where the enhancement circuit 110 is coupled to the resistor RN1 as required.

In the embodiments of FIG. 4 and FIG. 5, the enhancement circuits 108 and 110 are respectively implemented by a P-type transistor M1 and an N-type transistor M2, but the disclosure is not limited thereto. The P-type transistor M1 is coupled between the power supply voltage VDD and the resistor RP1, the N-type transistor M2 is coupled between the resistor RN1 and the power supply voltage VSS, and the power supply voltage VSS may be, for example, a ground voltage, but the disclosure is not limited thereto. The control circuit 102 may enhance the signal strength of the driving signals of the pull-up driver 104 and the pull-down driver 106 by controlling the conduction states of the P-type transistor M1 and the N-type transistor M2, so as to improve the driving capability of the off-chip driving device and prevent the signal distortion of the output signal SO under high-speed transmission. When the input data signal D1 has a rising edge, the P-type transistor M1 is turned on, and the N-type transistor M2 is turned off, thereby increasing the charging current flowing through the resistor RP1. When the input data signal D1 has a falling edge, the N-type transistor M2 is turned on, and the P-type transistor M1 is turned off, thereby increasing the discharge current flowing through the resistor RN1.

Figure 6:
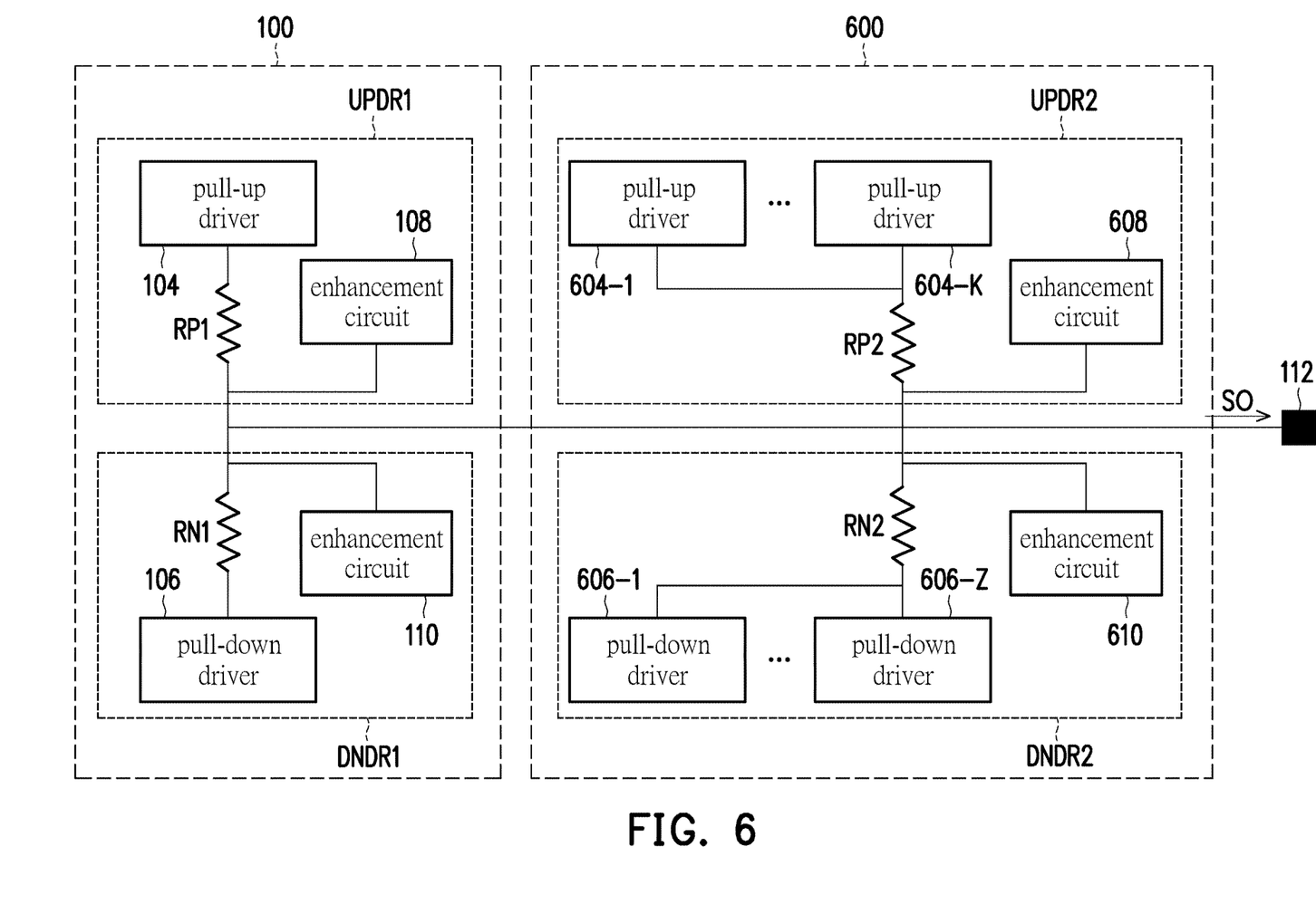
FIG. 6 is a schematic diagram of a driver circuit according to another embodiment of the disclosure.

In some embodiments, the off-chip driving device may further include a plurality of driver circuits. As shown in FIG. 6, the off-chip driving device further includes a driver circuit 600 besides the driver circuit 100 in the embodiment of FIG. 1 (for simplicity, the control circuit 102 is not shown in FIG. 6). An implementation of the driver circuit 600 is similar to that of the driver circuit 100, and the driver circuit 600 differs from the driver circuit 100 in that the driver circuit 600 includes a plurality of pull-up drivers 604-1 to 604-K and a plurality of pull-down drivers 606-1 to 606-Z, where K and Z are positive integers, and K may be equal to Z or K may not be equal to Z. The pull-up drivers 604-1 to 604-K are coupled to the control circuit 102 and are coupled to the input/output pad 112 through the resistor RP2, and the pull-down drivers 606-1 to 606-Z are coupled to the control circuit 102 and are coupled to the input/output pad 112 through the resistor RN2. The enhancement circuit 608 is coupled to the control circuit 102 and the resistor RP2, and the enhancement circuit 610 is coupled to the control circuit 102 and the resistor RN2. The implementations of the pull-up drivers 604-1 to 604-K, the pull-down drivers 606-1 to 606-Z, the enhancement circuit 608, and the enhancement circuit 610 are similar to the implementations of the pull-up driver 104, the pull-down driver 106, the enhancement circuit 108, and the enhancement circuit 110 of FIG. 1 to FIG. 5 and are not repeated here.

In the embodiment of FIG. 6, the driver circuit 100 may serve as a main driver circuit, and the driver circuit 600 may serve as an auxiliary driver circuit. For example, when the off-chip driving device provides the output signal SO according to the input data signal D1, the control circuit 102 may control the pull-up driver circuit UPDR1 and the pull-down driver circuit DNDR1 to roughly adjust the driving capability of the off-chip driving device, and control the pull-up driver circuit UPDR2 and the pull-down driver circuit DNDR2 to finely adjust the driving capability of the off-chip driving device, so as to ensure that the high-low level switching speed of the output signal SO provided by the off-chip driving device meets the requirements.

Figure 7:
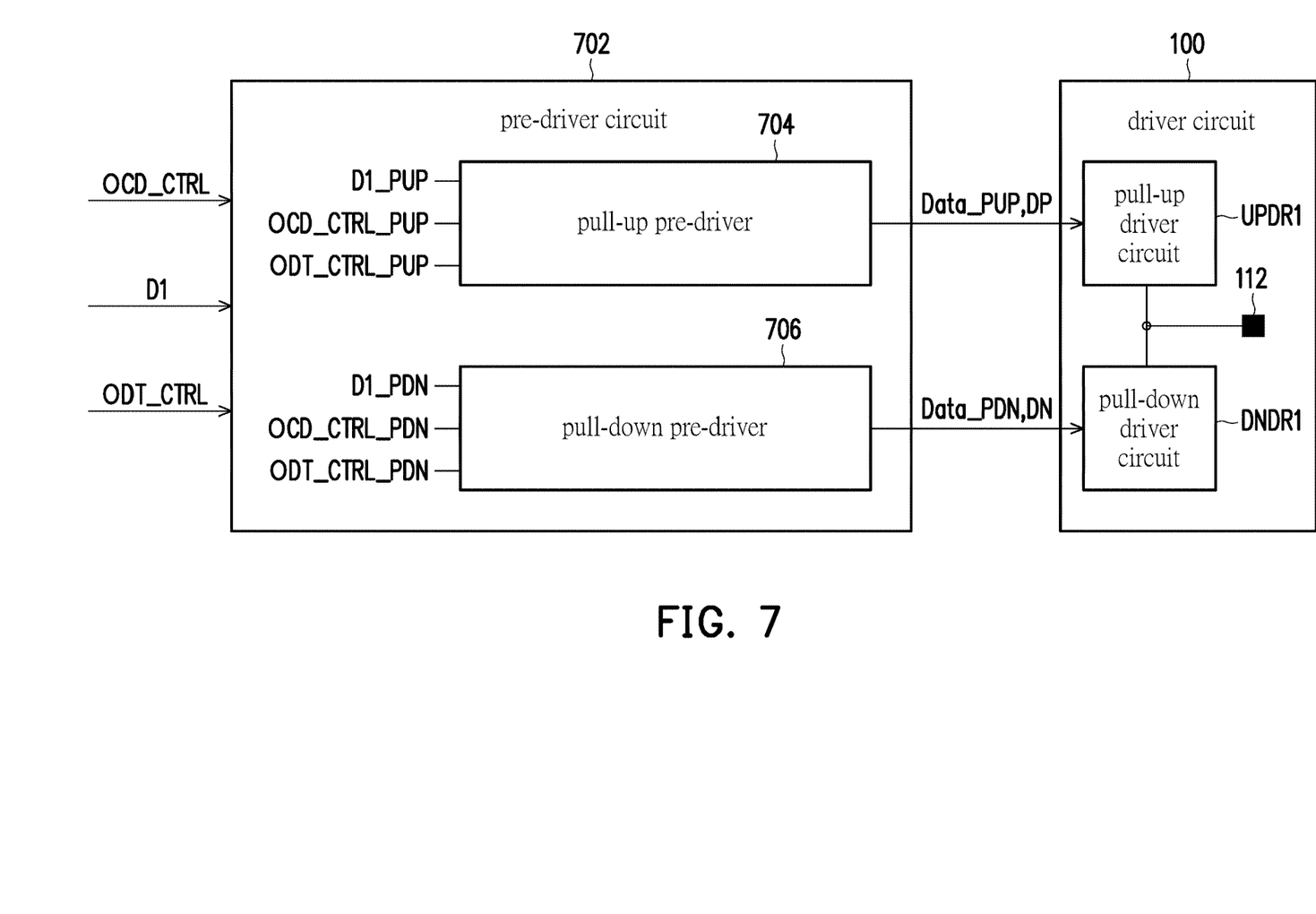
FIG. 7 is a schematic diagram of an off-chip driving device according to another embodiment of the disclosure.

Specifically, the control circuit 102 may be a pre-driver circuit 702 as shown in FIG. 7, and the pre-driver circuit 702 may include a pull-up pre-driver 704 and a pull-down pre-driver 706. In addition to receiving the input data signal D1 and an off-chip driving control signal OCD_CTRL for controlling the operations of the pull-up driver circuit UPDR1 and the pull-down driver circuit DNDR1, the pre-driver circuit 702 may also receive other control signals such as an on-die termination (ODT) control signal ODT_CTRL, but the disclosure is not limited thereto. For example, the pre-driver circuit 702 may also receive a ZQ calibration control signal, a slew rate control signal, etc. The off-chip driving control signal OCD_CTRL and the on-die termination control signal OD_CTRL may respectively include an off-chip driving control signal OCD_CTRL_PUP and an on-die termination control signal ODT_CTRL_PUP for controlling the pull-up pre-driver 704, and an off-chip driving control signal OCD_CTRL_PDN and an on-die termination control signal ODT_CTRL_PDN for controlling the pull-down pre-driver 706. In addition, the input data signal D1 may also include an input data signal D1_PUP to be output to the pull-up pre-driver 704 and an input data signal D1_PDN to be output to the pull-down pre-driver 706.

The pull-up pre-driver 704 may respectively output a pull-up control signal Data_PUP and an enhancement control signal DP to the pull-up driver circuit UPDR1 according to the input data signal D1_PUP (wherein the pull-up control signal Data_PUP is, for example, output to the gates of the transistors MP<1> to MP<X> in FIG. 2A and FIG. 2B, and the enhancement control signal DP is, for example, output to the gate of the transistor M1 in the embodiment of FIG. 4 and FIG. 5), so as to control the pull-up driver 104 to perform a pull-up operation and control the enhancement circuit 108 to provide the enhancement signal. The pull-down pre-driver 706 may respectively output a pull-down control signal Data_PDN and an enhancement control signal DN to the pull-down driver circuit DNDR1 according to the input data signal D1_PDN (wherein the pull-down control signal Data_PDN is, for example, output to the gates of the transistors MN<1> to MN<Y> in FIG. 3A and FIG. 3B, and the enhancement control signal DN is, for example, output to the gate of the transistor M2 in the embodiment of FIG. 4 and FIG. 5), so as to control the pull-down driver 106 to perform a pull-down operation and control the enhancement circuit 110 to provide the enhancement signal. In addition, in the case of the embodiment of FIG. 6, the pull-up control signal Data_PUP may include control signals input to the pull-up driver 104 and the pull-up drivers 604-1 to 604-K, and the pull-down control signal Data_PDN may include control signals input to the pull-down driver 106 and the pull-down drivers 606-1 to 606-Z.

Figure 8:
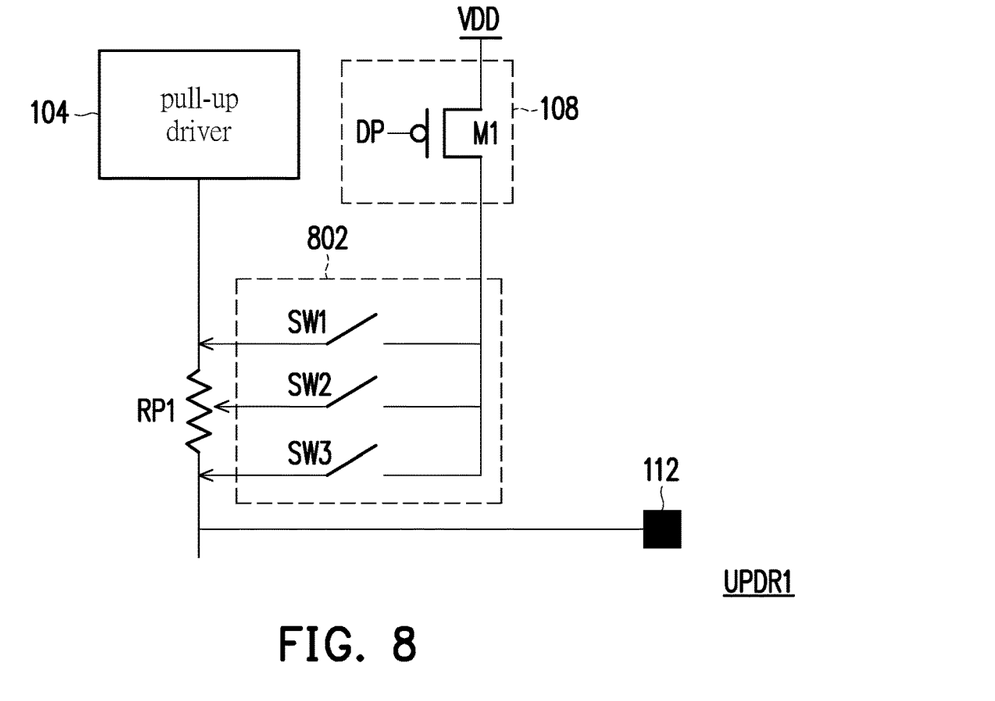
FIG. 8 is a schematic diagram of a pull-up driver circuit according to an embodiment of the disclosure.

Further, in some embodiments, an implementation of the pull-up driver circuit UPDR1 may be as shown in FIG. 8, which further includes a switching circuit 802. The switching circuit 802 is coupled between the enhancement circuit 108 and the resistor RP1. The switching circuit 802 may be controlled by the control circuit 102 to connect the enhancement circuit 108 to different positions of the resistor RP1. For example, in the embodiment of FIG. 8, the switching circuit 802 may include switches SW1 to SW3. The switch SW1 is coupled between one end of the resistor RP1 and the enhancement circuit 108, the switch SW2 is coupled between any middle position of the resistor RP1 and the enhancement circuit 108, and the switch SW3 is coupled between the other end of the resistor RP1 and the enhancement circuit 108. The control circuit 102 may connect the enhancement circuit 108 to different positions of the resistor RP1 by controlling the conduction states of the switches SW1 to SW3, so as to adjust the enhancement circuit 108 to enhance the strength of the driving signal of the pull-up driver 104.

Figure 9:
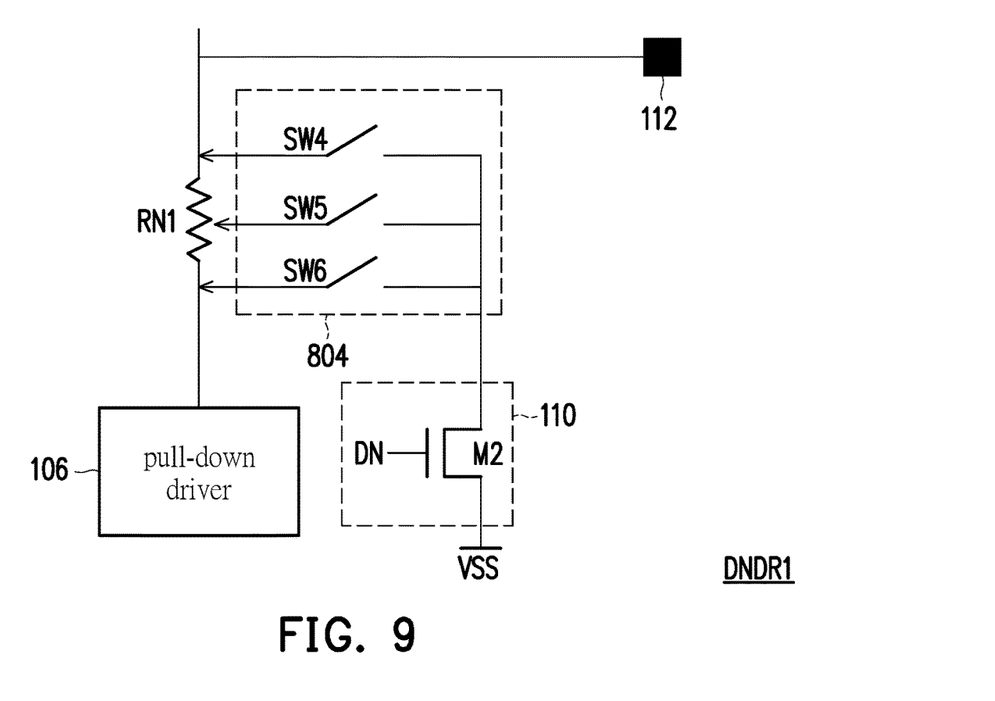
FIG. 9 is a schematic diagram of a pull-down driver circuit according to an embodiment of the disclosure.

Similarly, as shown in FIG. 9, the pull-down driver circuit DNDR1 may also include a switching circuit 804, and the switching circuit 804 is coupled between the enhancement circuit 110 and the resistor RN1. The switching circuit 804 may be controlled by the control circuit 102 to connect the enhancement circuit 110 to different positions of the resistor RN1. For example, in the embodiment of FIG. 9, the switching circuit 802 may include switches SW4 to SW6. The switch SW4 is coupled between one end of the resistor RN1 and the enhancement circuit 110, the switch SW5 is coupled between any middle position of the resistor RN1 and the enhancement circuit 110, and the switch SW6 is coupled between the other end of the resistor RN1 and the enhancement circuit 110. The control circuit 102 may connect the enhancement circuit 110 to different positions of the resistor RN1 by controlling the conduction states of the switches SW4 to SW6, so as to adjust the enhancement circuit 110 to enhance the strength of the driving signal of the pull-down driver 106. It should be noted that the number of switches included in each of the switching circuit 802 and the switching circuit 804 is not limited to three, and in other embodiments, the switching circuit 802 and the switching circuit 804 may respectively include more or less switches, and the number of switches in the switching circuit 802 may be different from the number of switches in the switching circuit 804.

In addition, the switching circuits 802 and 804 described above may also be applied to the pull-up driver circuit UPDR2 and the pull-down driver circuit DNDR2 in the embodiment of FIG. 6. For example, the switching circuit 802 may be coupled between the enhancement circuit 608 and the resistor RP2, the switching circuit 804 may be coupled between the enhancement circuit 610 and the resistor RN2, and the switching circuit 802 and the switching circuit 804 may be used to connect the enhancement circuit 608 to any position of the resistor RP2 and connect enhancement circuit 610 to any position of the resistor RN2.

Figure 10:
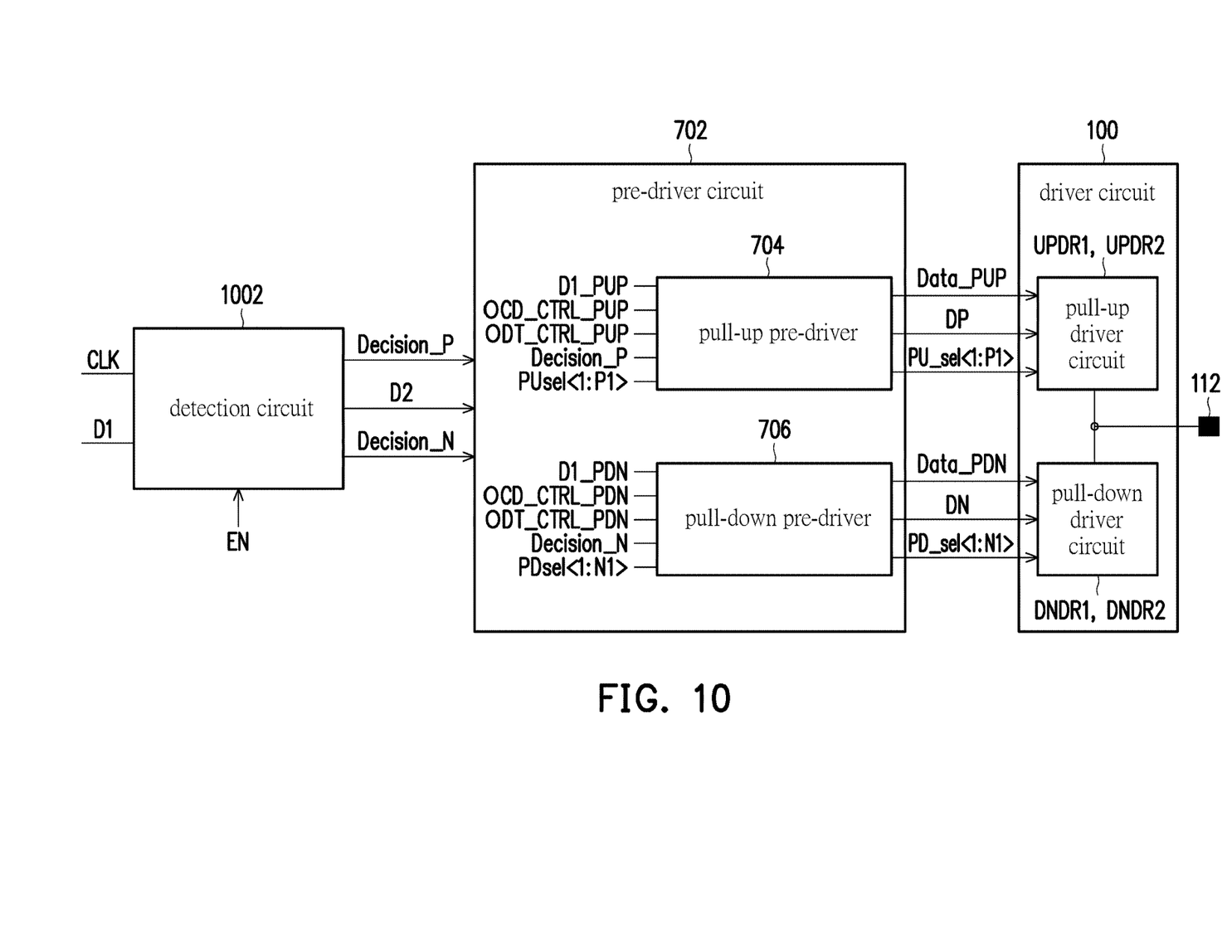
FIG. 10 is a schematic diagram of an off-chip driving device according to another embodiment of the disclosure.
Figure 11:
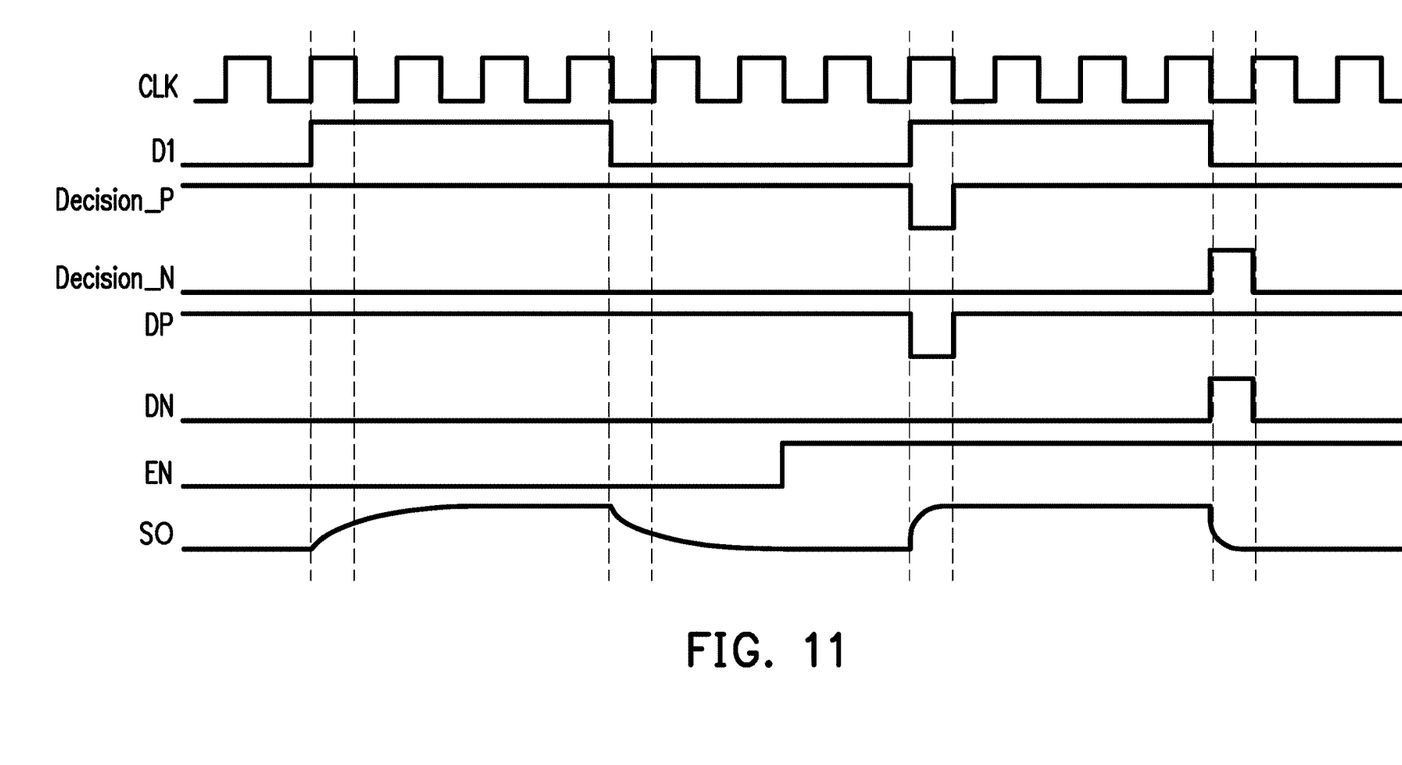
FIG. 11 is an operation timing diagram of the off-chip driving device according to the embodiment of FIG. 10.

FIG. 10 is a schematic diagram of an off-chip driving device according to another embodiment of the disclosure. FIG. 11 is an operation timing diagram of the off-chip driving device according to the embodiment of FIG. 10. Referring to FIG. 10 and FIG. 11, the difference between the embodiment of FIG. 10 and the embodiment of FIG. 7 is that: the embodiment of FIG. 10 further includes a detection circuit 1002, and the driver circuit 100 of the embodiment of FIG. 10 includes the pull-up driver circuits UPDR1 and UPDR2 and the pull-down driver circuits DNDR1 and DNDR2. In the embodiment of FIG. 7, the function of detecting the rising edge and the falling edge of the input data signal D1 is integrated into the pre-driver circuit 702. However, in this embodiment, the function of detecting the rising edge and the falling edge of the input data signal D1 is performed by the detection circuit 1002. The detection circuit 1002 may detect the rising edge and the falling edge of the input data signal D1 according to a clock signal CLK (in some embodiments, the detection circuit 1002 may detect the rising edge and the falling edge of the input data signal D1 without the clock signal CLK, for example, in the embodiment of FIG. 7, the pre-driver circuit 702 may not detect the rising and falling edge of the input data signal D1 according to the clock signal CLK.), and correspondingly output a detection signal Decision_P and a detection signal Decision_N. In addition, the detection circuit 1002 can also output the input data signal D1 as the input data signal D2 to the pre-driver circuit 702. The pull-up pre-driver 704 and the pull-down pre-driver 706 may obtain the occurrence times of the rising edge and the falling edge of the input data signal D1 according to the detection signal Decision_P and the detection signal Decision_N, respectively, and correspondingly output the enhancement control signal DP and the enhancement control signal DN.

In addition, the pull-up pre-driver 704 and the pull-down pre-driver 706 can also respectively receive the switching control signals PUsel1<1:P1> and the switching control signals PDsel1<1:N1>, and respectively output the switching control signals PUsel1<1:P1> and the switching control signals PDsel1<1:N1> to the switching circuit 802 shown in FIG. 8 and the switching circuit 804 shown in FIG. 9. The switch control signals PUsel1<1:P1> are used to control the switches SW1~SW3 in the switch circuit 802 shown in FIG. 8, and the switch control signals PDsel1<1:N1> is used to control the switches SW4~SW6 in the switch circuit 802 shown in FIG. 9. It is noted that P1 and N1 can be changed according to the number of switches included in the switching circuits 802 and 804, and are not limited that P1 must be equal to N1.

Further, since the driver circuit 100 in the embodiment of FIG. 10 includes the pull-up driver circuits UPDR1 and UPDR2 and the pull-down driver circuits DNDR1 and DNDR2, the pull-up control signal Data_PUP includes the control signals input to the pull-up driver 104 and the pull-up drivers 604-1 to 604-K, and the pull-down control signal Data_PDN includes the control signals input to the pull-down driver 106 and the pull-down drivers 606-1 to 606-Z.

In addition, the detection circuit 1002 may determine whether to detect the rising edge and the falling edge of the input data signal D1 according to the enable signal EN. When the detection circuit 1002 does not detect the rising edge and the falling edge of the input data signal D1, that is, when the detection circuit 1002 does not provide the detection signal Decision_P and the detection signal Decision_N, the pre-driver circuit 702 does not provide the enhancement control signal DP and the enhancement control signal DN to the pull-up driver circuits UPDR1 and UPDR2 and the pull-down driver circuits DNDR1 and DNDR2, either. Therefore, the enhancement circuits 108, 110, 608, and 610 of the pull-up driver circuits UPDR1 and UPDR2 and the pull-down driver circuits DNDR1 and DNDR2 do not provide the enhancement signals.

As shown in FIG. 11, when the enable signal EN is at a low voltage level, since the enhancement circuits 108, 110, 608, and 610 do not provide the enhancement signals, it takes a longer time for the output signal SO to rise or fall to the target voltage level. When the enable signal EN is at a high voltage level, the enhancement circuits 108, 110, 608, and 610 provide the enhancement signals, so that the output signal SO rises or falls to the target voltage level within a half cycle of the clock signal CLK, which greatly improves the signal quality of the output signal SO.

Figure 12:
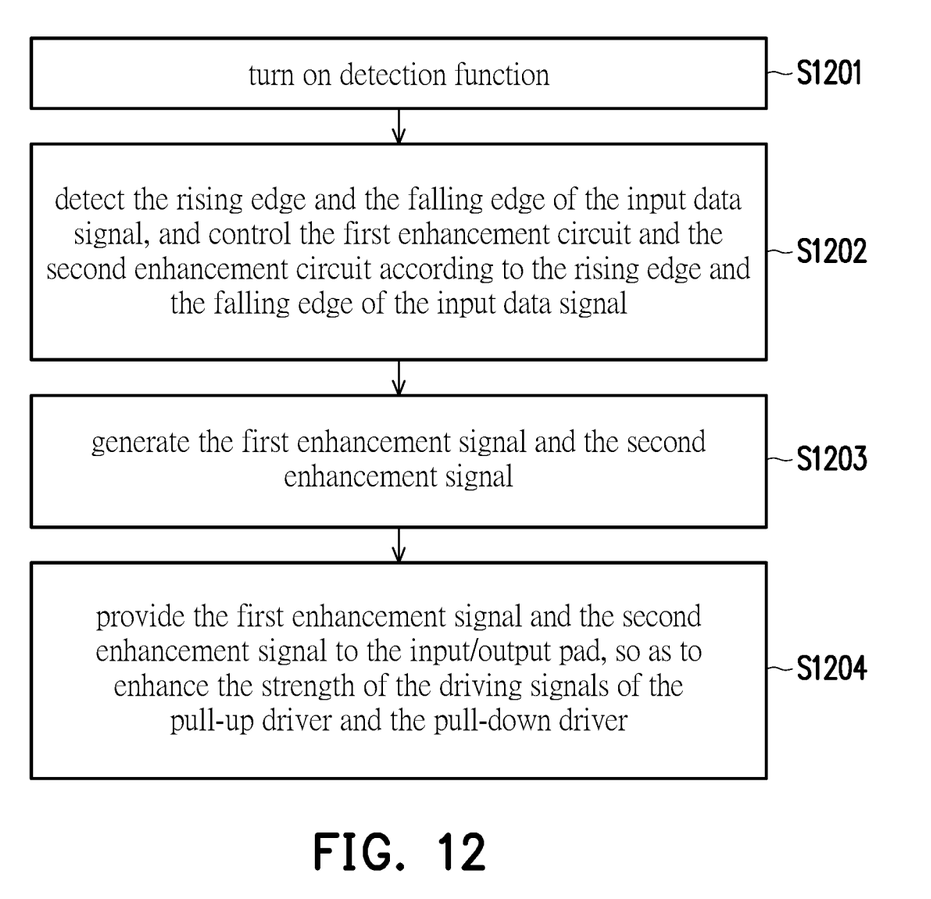
FIG. 12 is a flowchart of a driving capability enhancement method of an off-chip driving device according to an embodiment of the disclosure.

FIG. 12 is a flowchart of a driving capability enhancement method of an off-chip driving device according to an embodiment of the disclosure. The off-chip driving device includes at least one pull-up driver, at least one first resistor, a first enhancement circuit, a pull-down driver, and at least one second resistor. The first resistor is coupled between the pull-up driver and an input/output pad. The second resistor is coupled between the pull-down driver and the input/output pad. The first enhancement circuit is coupled to the first resistor, and the second enhancement circuit is coupled to the second resistor. Further, the first enhancement circuit may be connected to the first end of the first resistor, the second end of the first resistor, or any position between the first end and the second end of the first resistor. The second enhancement circuit may be connected to the first end of the second resistor, the second end of the second resistor, or any position between the first end and the second end of the second resistor. It can be known from the above embodiments that the driving capability enhancement method of the off-chip driving device may include at least the following steps. First, detection function is turned on (step 1201). And then, the rising edge and the falling edge of the input data signal are detected, and the first enhancement circuit and the second enhancement circuit are controlled according to the rising edge and the falling edge of the input data signal (step S1202), so as to generate the first enhancement signal and the second enhancement signal (step S1203). The detection of the rising edge and falling edge of the input data signal can be performed based on the clock signal or not based on the clock signal. At last, the first enhancement signal and the second enhancement signal are provided to the input/output pad, so as to enhance the strength of the driving signals of the pull-up driver and the pull-down driver (step S1204). In some embodiments, the first enhancement circuit and the second enhancement circuit may be controlled to provide the first enhancement signal and the second enhancement signal when the off-chip driving device is in the enhancement mode according to the enable signal, and the first enhancement circuit and the second enhancement circuit may be controlled not to provide the first enhancement signal and the second enhancement signal when the off-chip driving device is in the normal mode.

To sum up, the off-chip driving device according to an embodiment of the disclosure is capable of detecting the rising edge and the falling edge of the input data signal, and controlling the first enhancement circuit and the second enhancement circuit to provide the first enhancement signal and the second enhancement signal to the input/output pad according to the rising edge and the falling edge of the input data signal, so as to improve the slew rate and the output swing of the output signal, enhance the strength of the driving signals of the pull-up driver and the pull-down driver, and improve the driving capability of the off-chip driving device, thereby preventing signal distortion under high-speed transmission and improving the quality of the output signal of the off-chip driving device.

What is claimed is:

1. An off-chip driving device, comprising:
a driver circuit comprising:
at least one pull-up driver;
at least one first resistor coupled between the at least one pull-up driver and an input/output pad;
a first enhancement circuit coupled to the at least one first resistor; and
a first switching circuit coupled between the first enhancement circuit and the at least one first resistor; and
a control circuit coupled to the at least one pull-up driver and the first enhancement circuit, and detecting a rising edge and a falling edge of an input data signal and controlling the first enhancement circuit to provide a first enhancement signal to the input/output pad according to the rising edge and the falling edge of the input data signal, wherein the first switching circuit is controlled by the control circuit to switch the first enhancement circuit to be connected to the first end of the at least one first resistor, the second end of the at least one first resistor, or the position between the first end and the second end of the at least one first resistor.

2. The off-chip driving device according to claim 1, wherein the first switching circuit comprises a plurality of first switches respectively coupled between the first enhancement circuit and corresponding connection positions on the at least one first resistor, and conduction states of the first switches are controlled by the control circuit.

3. The off-chip driving device according to claim 2, wherein the driver circuit further comprises:
a pull-down driver, coupled to the control circuit;
at least one second resistor coupled between the pull-down driver and the input/output pad; and a second enhancement circuit coupled to the control circuit and the at least one second resistor, the control circuit controls the second enhancement circuit to provide a second enhancement signal to the input/output pad according to the rising edge and the falling edge of the input data signal.

4. The off-chip driving device according to claim 3, wherein the second enhancement circuit is connected to a first end of the at least one second resistor, a second end of the at least one second resistor, or a position between the first end and the second end of the at least one second resistor.

5. The off-chip driving device according to claim 4, wherein the driver circuit further comprises:
a second switching circuit coupled between the second enhancement circuit and the at least one second resistor, and controlled by the control circuit to switch the second enhancement circuit to be connected to the first end of the at least one second resistor, the second end of the at least one second resistor, or the position between the first end and the second end of the at least one second resistor.

6. The off-chip driving device according to claim 5, wherein the second switching circuit comprises a plurality of second switches respectively coupled between the second enhancement circuit and corresponding connection positions on the at least one second resistor, and conduction states of the second switches are controlled by the control circuit.

7. The off-chip driving device according to claim 3, wherein the control circuit further controls the second enhancement circuit to provide the second enhancement signal in response to the off-chip driving device being in an enhancement mode according to an enable signal, and controls the second enhancement circuit not to provide the second enhancement signal in response to the off-chip driving device being in a normal mode.

8. The off-chip driving device according to claim 3, wherein the second enhancement circuit comprises:
an N-type transistor coupled between the at least one first resistor and a ground voltage, wherein a control end of the N-type transistor is coupled to the control circuit, and the N-type transistor is controlled by the control circuit to be turned on in response to the input data signal having the falling edge.

9. The off-chip driving device according to claim 1, wherein the control circuit further controls the first enhancement circuit to provide the first enhancement signal in response to the off-chip driving device being in an enhancement mode according to an enable signal, and controls the first enhancement circuit not to provide the first enhancement signal in response to the off-chip driving device being in a normal mode.

10. The off-chip driving device according to claim 1, wherein the first enhancement circuit comprises:
a P-type transistor coupled between a power supply voltage and the at least one first resistor, wherein a control end of the P-type transistor is coupled to the control circuit, and the P-type transistor is controlled by the control circuit to be turned on in response to the input data signal having the rising edge.

11. A driving capability enhancement method of an off-chip driving device, which comprises at least one pull-up driver, at least one first resistor, a first enhancement circuit, a second enhancement circuit, a pull-down driver, a first switching circuit and at least one second resistor, wherein the at least one first resistor is coupled between the at least one pull-up driver and an input/output pad, the at least one second resistor is coupled between the pull-down driver and the input/output pad, the first enhancement circuit is coupled to the at least one first resistor, and the second enhancement circuit is coupled to the at least one second resistor, the driving capability enhancement method of the off-chip driving device comprising:
detecting a rising edge and a falling edge of an input data signal:
controlling the first enhancement circuit and the second enhancement circuit to provide a first enhancement signal and a second enhancement signal to the input/output pad according to the rising edge and the falling edge of the input data signal, to enhance strength of driving signals of the at least one pull-up driver and the pull-down driver; and
controlling the first switching circuit to switch the first enhancement circuit to be connected to a first end of the at least one first resistor, a second end of the at least one first resistor, or a position between the first end and the second end of the at least one first resistor.

12. The driving capability enhancement method of the off-chip driving device according to claim 11, wherein the second enhancement circuit is connected to a first end of the at least one second resistor, a second end of the at least one second resistor, or a position between the first end and the second end of the at least one second resistor.

13. The driving capability enhancement method of the off-chip driving device according to claim 11, comprising:
controlling the first enhancement circuit and the second enhancement circuit to provide the first enhancement signal and the second enhancement signal in response to the off-chip driving device being in an enhancement mode according to an enable signal, and controlling the first enhancement circuit and the second enhancement circuit not to provide the first enhancement signal and the second enhancement signal in response to the off-chip driving device being in a normal mode.

* * * * *